(12) United States Patent
Sun et al.

(10) Patent No.: US 10,648,100 B1
(45) Date of Patent: May 12, 2020

(54) METHOD FOR CARRYING OUT PHOSPHIDE IN-SITU INJECTION SYNTHESIS BY CARRIER GAS

(71) Applicant: THE 13TH RESEARCH INSTITUTE OF CHINA ELECTRONICS TECHNOLOGY GROUP CORPORATION, Shijiazhuang, Hebei (CN)

(72) Inventors: Niefeng Sun, Hebei (CN); Shujie Wang, Hebei (CN); Huisheng Liu, Hebei (CN); Tongnian Sun, Hebei (CN)

(73) Assignee: THE 13TH RESEARCH INSTITUTE OF CHINA ELECTRONICS TECHNOLOGY GROUP CORPORATION, Shijiazhuang, Hebei (CN)

( * ) Notice: Subject to any disclaimer, the term of this patent is extended or adjusted under 35 U.S.C. 154(b) by 0 days.

(21) Appl. No.: 16/475,831

(22) PCT Filed: Dec. 11, 2017

(86) PCT No.: PCT/CN2017/115468
§ 371 (c)(1),
(2) Date: Jul. 3, 2019

(87) PCT Pub. No.: WO2019/109366
PCT Pub. Date: Jun. 13, 2019

(30) Foreign Application Priority Data

Dec. 8, 2017 (CN) .......................... 2017 1 1298581

(51) Int. Cl.
*C30B 11/06* (2006.01)
*C30B 28/12* (2006.01)
(Continued)

(52) U.S. Cl.
CPC .............. *C30B 28/12* (2013.01); *B01F 3/028* (2013.01); *C30B 29/44* (2013.01); *C30B 35/002* (2013.01); *C30B 35/005* (2013.01); *C30B 35/007* (2013.01)

(58) Field of Classification Search
CPC ......... C30B 28/12; C30B 29/44; C30B 11/04; C30B 11/06; C30B 11/065
See application file for complete search history.

(56) References Cited

U.S. PATENT DOCUMENTS 5,431,125 A * 7/1995 Bachowski ............. C30B 15/26
117/13
5,524,571 A * 6/1996 Kawasaki .................. B01J 3/04
117/17
5,869,398 A 2/1999 Knight

FOREIGN PATENT DOCUMENTS

CN 102602902 A 7/2012
CN 102628180 A 8/2012
(Continued)

*Primary Examiner* — Robert M Kunemund
(74) *Attorney, Agent, or Firm* — Veros Legal Solutions, LLP

(57) ABSTRACT

The present invention discloses a method for carrying out phosphide in-situ injection synthesis by carrier gas, relating to a synthetic method of semiconductor crystal: step A, shielding inert gas is introduced into a furnace body through a carrier gas intake conduit; step B, a crucible is heated in the furnace body to melt a pre-synthesized raw material in the crucible; step C, the heated shielding inert gas is introduced into the furnace body through the carrier gas intake conduit; step D, a phosphorus source furnace loaded with red phosphorus is moved downwards until an injection conduit of the phosphorus source furnace is submerged in the melt; step E, the red phosphorus is heated by the phosphorus source furnace to produce phosphorus gas, and the phosphorus gas is mixed with the shielding inert gas and (Continued)

then injected into the melt through the injection conduit, and the phosphorus gas reacts with the melt to produce phosphide; and step F, each device is turned off after the synthesis is finished. In the present invention in the synthesis process, the shielding inert gas is introduced through the carrier gas intake conduit to enable the phosphorus gas to be stably injected into the melt, so that the melt is prevented from being sucked back into the phosphorus source furnace after the volatile element gas is completely absorbed.

9 Claims, 2 Drawing Sheets

(51) Int. Cl.
*C30B 29/44* (2006.01)
*C30B 35/00* (2006.01)
*B01F 3/02* (2006.01)

(56) References Cited

FOREIGN PATENT DOCUMENTS

| CN | 102965734 | * | 3/2013 |
|---|---|---|---|
| CN | 102965734 A | | 3/2013 |
| CN | 105543949 A | | 5/2016 |
| CN | 106381524 A | | 2/2017 |

* cited by examiner

METHOD FOR CARRYING OUT PHOSPHIDE IN-SITU INJECTION SYNTHESIS BY CARRIER GAS

CROSS-REFERENCE TO RELATED APPLICATIONS

This application claims priority to PCT Application No. PCT/CN2017/115468, filed on Dec. 11, 2017, which claims priority to Chinese Patent Application No. 201711298581.1, filed on Dec. 8, 2017, and each application is hereby incorporated by reference in its entirety.

TECHNICAL FIELD

The invention relates to a synthesis method of semiconductor crystal, in particular to a synthesis method of compound crystal material with volatile elements, such as indium phosphide, gallium phosphide and the like.

BACKGROUND ART

The compounds containing elements such as phosphorus or sulfur are widely used in the electronic industry, and they are important compound semiconductor materials such as indium phosphide and gallium phosphide. Because of the unique physical characteristics, these materials are widely used in many high-tech fields such as terahertz, optical communication, microwave, millimeter wave devices, radiation-resistant solar cells, etc. Therefore, compound semiconductor materials containing elements such as phosphorus or sulfur have been paid more and more attention.

Compounds containing elements such as phosphorus or sulfur are difficult to prepare due to their high dissociation pressures (e.g., 2.75 MPa for indium phosphide and 3.2 MPa for gallium phosphide). The current mainstream technologies are the Horizontal Bridgman/Horizontal Gradient Freeze (HB/HGF) and the injection synthesis method, but both of them have a problem of the explosion of the quartz sealing member, which makes the threshold and cost of synthetically preparing these materials high. The injection synthesis of phosphide is an efficient and rapid method for the synthesis of compounds, but due to strong reaction between gas and melt, suck-back easily occurs and thus leads to the explosion of phosphorus containers, which seriously affects the popularization and application of the method.

SUMMARY OF THE INVENTION

The problem to be solved by the invention is to provide a method for carrying out phosphide in-situ injection synthesis by carrier gas, wherein a shielding inert gas is used as carrier gas, and phosphorus gas in a phosphorus source furnace is injected into the melt in a crucible to synthesize phosphide, so that the melt is prevented from being sucked back into the phosphorus source furnace after the volatile element gas is completely absorbed.

In order to solve the above technical problem, the technical solution adopted by the invention is as follows: a method for carrying out phosphide in-situ injection synthesis by carrier gas, which is characterized by including the following steps of:

step A, introducing shielding inert gas into a furnace body through a carrier gas intake conduit, and the shielding inert gas is stopped being introduced when the pressure in the furnace body reaching a preset pressure is detected;

step B, heating the crucible in the furnace body to melt the pre-synthesized raw material in the crucible until the temperature required for phosphide synthesis is reached;

step C, introducing the carrier gas into the furnace body through a carrier gas intake conduit, and meanwhile opening and adjusting a carrier gas exhaust conduit so that the injection amount of the carrier gas is equal to the outflow amount of the gas;

step D, moving the phosphorus source furnace loaded with red phosphorus downwards until the injection conduit on the phosphorus source furnace is submerged in the melt and lowered close to the bottom of the crucible;

step E, heating the red phosphorus by the phosphorus source furnace to produce phosphorus gas, and mixing the phosphorus gas with the carrier gas and then injecting it into the melt through the injection conduit, and the phosphorus gas reacts with the melt to synthesize phosphide; and step F, after the synthesis is finished, slowly lifting and turning off the phosphorus source furnace, and then stopping introducing the carrier gas into the furnace body, and finally stopping heating the crucible.

The invention has the beneficial technical effects: 1, in the synthesis process of phosphide, the carrier gas (shielding inert gas such as nitrogen or argon) is introduced through the carrier gas intake conduit, such that the carrier gas enables phosphorus gas to be stably injected into the melt to prevent the melt from being sucked back into the phosphorus source furnace after volatile element gas is completely absorbed; 2, a phosphorus gas absorber is added so that the phosphorus gas can be prevented from polluting the environment; and 3, the whole process is stable, and the synthesis efficiency is high, and the explosion phenomenon of the volatile gas carrier is unlikely to occur.

The present invention will now be described in detail with reference to the accompanying drawings.

Figure 1:
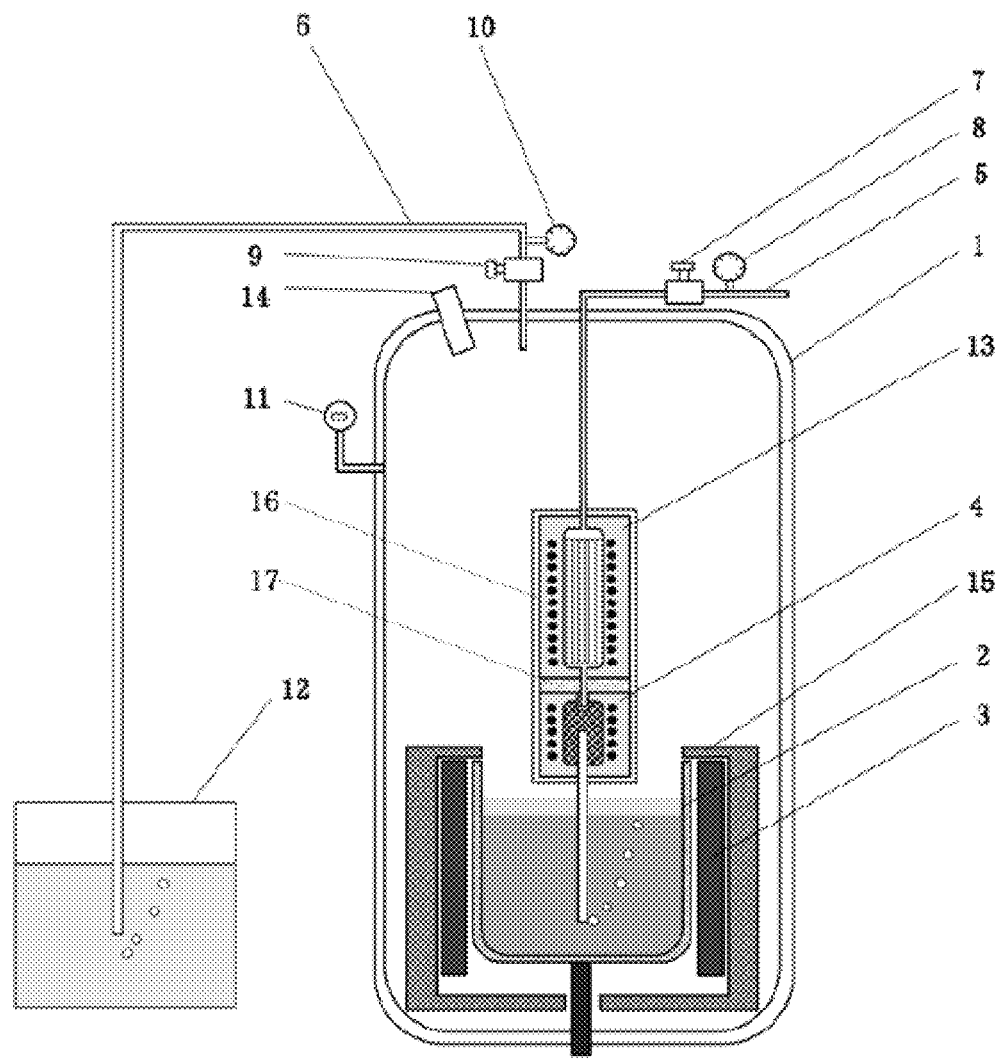
FIG. 1 is a schematic view showing an internal structure of a furnace body in a method for carrying out phosphide in-situ injection synthesis by carrier gas according to the present invention.

Throughout the drawings: 1 is a furnace body, 2 is a crucible, 3 is a crucible heating device, 4 is a phosphorus source furnace, 4-1 is a solid phosphorus loader, 4-2 is a thermal insulating sleeve, 4-3 is a heating wire, 4-4 is an injection conduit, 5 is a carrier gas intake conduit, 6 is a carrier gas exhaust conduit, 7 is a first pressure reducing valve, 8 is a first flow meter, 9 is a second pressure reducing valve, 10 is a second flow meter, 11 is a pressure gauge, 12 is a phosphorus absorber, 13 is a carrier gas heating device, 13-1 is a carrier gas heating conduit, 13-2 is a carrier gas heating and thermal insulating cavity, 13-3 is a carrier gas heating wire, 13-4 is a carrier gas injection conduit, 13-5 is a carrier gas heating multi-tube conduit, 14 is an observation window, 15 is a heat preserving device, 16 is a connecting sleeve, and 17 is a heat insulating layer.

DETAILED DESCRIPTION OF THE INVENTION

The invention provides a method for carrying out phosphide in-situ injection synthesis by carrier gas, wherein the carrier gas is used for stably injecting phosphorus gas into melt so as to synthesize phosphide, and the melt can be prevented from being sucked back into a phosphorus source furnace.

Embodiment 1

Step A, shielding inert gas was introduced into a furnace body 1 through a carrier gas intake conduit 5, and the shielding inert gas was stopped being introduced when the pressure in the furnace body 1 reaching a preset pressure was detected. The preset pressure set in the step was greater than the dissociation pressure required to synthesize the compound melt.

In this embodiment, the carrier gas intake conduit 5 was communicated with a phosphorus source furnace 4, and the shielding inert gas (nitrogen or argon) and the carrier gas (nitrogen or argon) both entered the furnace body 1 through the phosphorus source furnace 4.

Step B, a crucible 2 in the furnace body 1 was heated to melt the pre-synthesized raw material in the crucible 2 until the temperature required for phosphide synthesis was reached.

Step C, the carrier gas was introduced into the furnace body 1 through the carrier gas intake conduit 5, and meanwhile a carrier gas exhaust conduit 6 was opened and adjusted so that the injection amount of the carrier gas was equal to the outflow amount of the gas. In the step, the temperature of the carrier gas introduced was 850° C. –900° C.

A first pressure reducing valve 7 and a first flow meter 8 were arranged on the carrier gas intake conduit 5, and the first pressure reducing valve 7 and the first flow meter 8 were located outside the furnace body 1. A second pressure reducing valve 9 and a second flow meter 10 were arranged on the carrier gas exhaust conduit 6, and the second pressure reducing valve 9 and the second flow meter 10 were located outside the furnace body 1. By arranging the pressure reducing valve and the flow meter, the flow rate and the charging pressure of the carrier gas could be controlled, and the pressure of the charged carrier gas ought to be greater than the pressure inside the furnace body 1.

The gas discharged from the carrier gas exhaust conduit 6 was introduced into a phosphorus absorber 12 loaded with high-purity cooling water to absorb unreacted phosphorus gas of step E, so that the environment was prevented from being polluted, and the discharged phosphorus which cooled into a solid could be recycled.

Step D, the phosphorus source furnace 4 loaded with red phosphorus was moved down until an injection conduit 4-4 of the phosphorus source furnace 4 was submerged in the melt and it was lowered close to the bottom of the crucible 2.

Step E, the red phosphorus was heated by the phosphorus source furnace 4 to produce phosphorus gas; the phosphorus gas was mixed with the carrier gas, and then injected into the melt through the injection conduit 4-4; and the phosphorus gas reacted with the melt to synthesize phosphide.

And step F, after the synthesis was finished, the phosphorus source furnace 4 was slowly lifted and turned off, and then the carrier gas was stopped being introduced into the furnace body 1, and finally the crucible 2 was stopped being heated.

Embodiment 2

Step A, shielding inert gas was introduced into a furnace body 1 through a carrier gas intake conduit 5, and the shielding inert gas was stopped being introduced when the pressure in the furnace body 1 reaching a preset pressure was detected. The preset pressure set in the step was greater than the dissociation pressure required to synthesize the compound melt.

Unlike embodiment 1, in this embodiment, the carrier gas intake conduit 5 was communicated with a carrier gas heating device 13, which was communicated with a phosphorus source furnace 4, and the shielding inert gas and the carrier gas entered the furnace body 1 through the carrier gas intake conduit 5, the carrier gas heating device 13 and the phosphorus source furnace 4.

Step B, a crucible 2 in the furnace body 1 was heated to melt the pre-synthesized raw material in the crucible 2 until the temperature required for phosphide synthesis was reached.

Step C, the carrier gas was introduced into the furnace body 1 through the carrier gas intake conduit 5, and meanwhile a carrier gas exhaust conduit 6 was opened and adjusted so that the injection amount of the carrier gas was equal to the outflow amount of the gas. In the step, the carrier gas was heated by the carrier gas heating device 13 so that the temperature of the heated carrier gas was 850° C. –900° C.

A first pressure reducing valve 7 and a first flow meter 8 were arranged on the carrier gas intake conduit 5, and the first pressure reducing valve 7 and the first flow meter 8 were located outside the furnace body 1. A second pressure reducing valve 9 and a second flow meter 10 were arranged on the carrier gas exhaust conduit 6, and the second pressure reducing valve 9 and the second flow meter 10 were located outside the furnace body 1. By arranging the pressure reducing valve and the flow meter, the flow rate and the charging pressure of the carrier gas could be controlled, and the pressure of the charged carrier gas ought to be greater than the pressure inside the furnace body 1.

The gas discharged from the carrier gas exhaust conduit 6 was introduced into a phosphorus absorber 12 loaded with high-purity cooling water to absorb unreacted phosphorus gas of step E, so that the environment was prevented from being polluted, and the discharged phosphorus which cooled into a solid could be recycled.

Step D, the phosphorus source furnace 4 loaded with red phosphorus and the carrier gas heating device 13 were moved down until an injection conduit 4-4 of the phosphorus source furnace 4 was submerged in the melt and they were lowered close to the bottom of the crucible 2.

Step E, the red phosphorus was heated by the phosphorus source furnace 4 to produce phosphorus gas; the phosphorus gas was mixed with the carrier gas, and then injected into the melt through the injection conduit 4-4; and the phosphorus gas reacted with the melt to synthesize phosphide. The carrier gas and the unreacted phosphorus gas overflowed the melt into a furnace cavity of the furnace body 1.

And step F, after the synthesis was finished, the phosphorus source furnace 4 was slowly lifted and turned off, and then the carrier gas was stopped being introduced into the furnace body 1, and finally the crucible 2 was stopped being heated.

In the above embodiments, the shielding inert gas and the carrier gas are argon or nitrogen.

Figure 2:
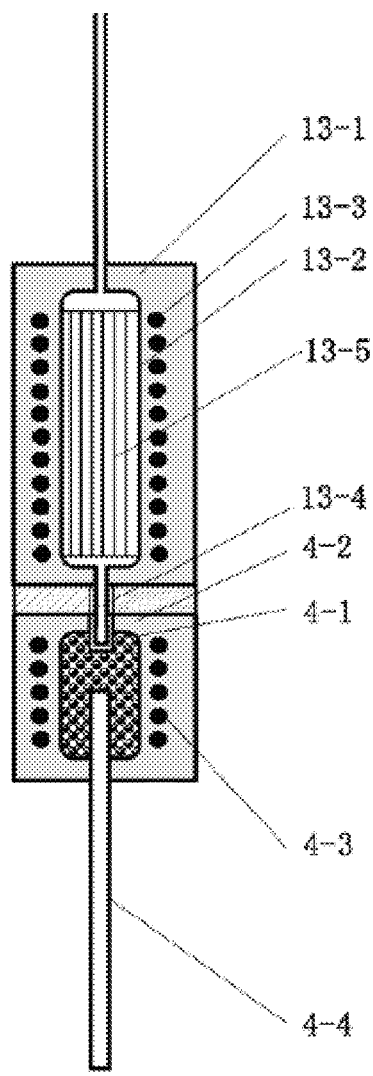
FIG. 2 is a schematic structural view of a phosphorus source furnace and a gas heating device of FIG. 1.

Referring to FIGS. 1 and 2, in the present invention, a crucible 2 is arranged at the bottom of a furnace cavity of a furnace body 1; a crucible heating device 3 is arranged outside the crucible 2; a heat preserving device 15 is arranged between the furnace body 1 and the crucible heating device 3; a phosphorus source furnace 4 is arranged above the crucible 2; a carrier gas intake conduit 5 and a carrier gas exhaust conduit 6 are arranged on the furnace body 1; the carrier gas intake conduit 5 is communicated with the phosphorus source furnace 4 through the furnace body 1; and the carrier gas exhaust conduit 6 is communicated with the furnace cavity of the furnace body 1.

A pressure gauge 11 is provided on the furnace body 1 for easy observation of the pressure in the furnace. A viewing window 14 is provided on the furnace body 1 for easy viewing of the synthesis process.

The structure of the phosphorus source furnace 4 includes a solid phosphorus loader 4-1, a thermal insulating sleeve 4-2 positioned outside the solid phosphorus loader 4-1, a heating wire 4-3 arranged in the thermal insulating sleeve 4-2, and an injection conduit 4-4 for communicating the solid phosphorus loader 4-1 with the melt in the crucible 2.

The carrier gas intake conduit 5 is provided with a gas heating device 13, which is positioned in the furnace cavity of the furnace body 1. The structure of the gas heating device 13 includes a carrier gas heating conduit 13-1 with a carrier gas heating heat preserving cavity 13-1, a carrier gas heating wire 13-3 arranged on the carrier gas heating conduit 13-1, and a carrier gas injection conduit 13-4 for communicating the carrier gas heating conduit 13-1 with the phosphorus source furnace 4. A carrier gas heating multi-tube conduit 13-5 is arranged in the carrier gas heating conduit 13-1.

The phosphorus source furnace 4 and the carrier gas heating device 13 are arranged in a connecting sleeve 16, and an insulating layer 17 is further arranged between the phosphorus source furnace 4 and the carrier gas heating device 13. With the arrangement of the connecting sleeve 16, the phosphorus source furnace 4 is integrated with the carrier gas heating device 13, and the carrier gas intake conduit 5 is connected to the connecting sleeve 16. The phosphorus source furnace 4 and the carrier gas heating device 13 are driven to move up and down by moving the carrier gas intake conduit 5 up and down via the supporting lifting device.

Finally, it should be noted that the above embodiments are only intended to illustrate and not to limit the technical solution of the present invention; although the present invention has been described in detail with reference to preferred embodiments thereof, it will be understood by those skilled in the art that modifications may be made in the specific embodiments of the present invention or equivalents may be substituted for some technical features; and they are intended to be within the scope of the claimed technical solution of the present invention without departing from the spirit of the technical solution of the present invention.

The invention claimed is:

1. A method for carrying out phosphide in-situ injection synthesis by carrier gas, characterized by comprising the following steps of:
   step A, introducing shielding inert gas into a furnace body through a carrier gas intake conduit, and stopping introducing the shielding inert gas when the pressure in the furnace body reaching a preset pressure is detected;
   step B, heating a crucible in the furnace body to melt a pre-synthesized raw material in the crucible until the temperature required for phosphide synthesis is reached;
   step C, introducing the carrier gas into the furnace body through the carrier gas intake conduit, and meanwhile opening and adjusting a carrier gas exhaust conduit to enable the injection amount of the carrier gas to be equal to the outflow amount of the gas;
   step D, moving a phosphorus source furnace loaded with red phosphorus downwards until an injection conduit of the phosphorus source furnace is submerged in the melt and lowered close to the bottom of the crucible;
   step E, heating the red phosphorus with the phosphorus source furnace to produce phosphorus gas, and mixing the phosphorus gas with the carrier gas and then injecting it into the melt through the injection conduit, and the phosphorus gas reacts with the melt to synthesize phosphide; and
   step F, after the synthesis is finished, slowly lifting and turning off the phosphorus source furnace and then stopping introducing the carrier gas into the furnace body, and finally stopping heating the crucible;
   wherein, in step A, the carrier gas intake conduit is communicated with the phosphorus source furnace, and the shielding inert gas enters the furnace body through the carrier gas intake conduit and the phosphorus source furnace.

2. The method for carrying out phosphide in-situ injection synthesis by carrier gas according to claim 1, characterized in that the preset pressure in step A is greater than a dissociation pressure required to synthesize the compound melt.

3. The method for carrying out phosphide in-situ injection synthesis by carrier gas according to claim 1, characterized in that in step C the temperature of the carrier gas introduced into the furnace body is 850° C.-900° C.

4. The method for carrying out phosphide in-situ injection synthesis by carrier gas according to claim 1, characterized in that in step C the carrier gas is heated through a carrier gas heating device arranged in the furnace body, and the temperature of the heated carrier gas is 850° C.-900° C., the carrier gas intake conduit is communicated with the carrier gas heating device, the carrier gas heating device is communicated with the phosphorus source furnace, and the shielding inert gas and the carrier gas enter the furnace body through the carrier gas intake conduit, the carrier gas heating device and the phosphorus source furnace.

5. The method for carrying out phosphide in-situ injection synthesis by carrier gas according to claim 1, characterized in that in step C the gas discharged from the carrier gas exhaust conduit is introduced into a phosphorus absorber loaded with high-purity cooling water.

6. The method for carrying out phosphide in-situ injection synthesis by carrier gas according to claim 1, characterized in that the shielding inert gas and the carrier gas are argon or nitrogen.

7. The method for carrying out phosphide in-situ injection synthesis by carrier gas according to claim 1, characterized in that the crucible is arranged at the bottom of a furnace cavity of the furnace body; a crucible heating device is arranged outside the crucible; a thermal insulating device is arranged between the furnace body and the crucible heating device; the phosphorus source furnace is positioned above the crucible; the carrier gas intake conduit and the carrier gas exhaust conduit are arranged on the furnace body; the carrier gas intake conduit is communicated with the phosphorus source furnace through the furnace body; and the carrier gas exhaust conduit is communicated with the furnace cavity of the furnace body.

8. The method for carrying out phosphide in-situ injection synthesis by carrier gas according to claim 7, characterized in that the structure of the phosphorus source furnace comprises a solid phosphorus loader, a thermal insulating sleeve located outside the solid phosphorus loader, a heating wire arranged in the thermal insulating sleeve, and an injection conduit for communicating the solid phosphorus loader with the melt in the crucible.

9. The method for carrying out phosphide in-situ injection synthesis by carrier gas according to claim 8, characterized in that the carrier gas heating device is provided on the carrier gas intake conduit; the carrier gas heating device is located in the furnace cavity of the furnace body; the structure of the carrier gas heating device comprises a carrier gas heating conduit having a carrier gas heating and thermal insulating cavity, a carrier gas heating wire arranged on the carrier gas heating conduit, and a carrier gas injection conduit for communicating the inside of the carrier gas heating conduit with the phosphorus source furnace.

\* \* \* \* \*